United States Patent [19]

Rovnyak et al.

[11] Patent Number: 4,602,317

[45] Date of Patent: Jul. 22, 1986

[54] PRINTED WIRING BOARD CONNECTOR

[75] Inventors: Richard M. Rovnyak, Shaumburg; Anthony Traina, Villa Park, both of Ill.

[73] Assignee: GTE Communication Systems Corporation, Northlake, Ill.

[21] Appl. No.: 681,412

[22] Filed: Dec. 13, 1984

[51] Int. Cl.$^4$ .............................................. H01R 23/68
[52] U.S. Cl. .................................. 361/413; 339/17 F; 339/75 P; 339/176 MF; 361/398
[58] Field of Search ............ 339/17 C, 17 M, 17 LM, 339/17 F, 176 MF, 176 MP, 75 MP, 75 P; 361/398, 412, 413

[56] References Cited

U.S. PATENT DOCUMENTS

| | | | |
|---|---|---|---|
| 4,365,857 | 12/1982 | Watanabe et al. | 339/176 MP |
| 4,410,222 | 10/1983 | Enomoto et al. | 339/17 F |
| 4,457,575 | 7/1984 | Davis et al. | 339/176 MP |
| 4,475,785 | 10/1984 | Müller et al. | 339/176 MF |

OTHER PUBLICATIONS

Clarke et al., "Polarized Connector", IBM Technical Disclosure Bulletin, vol. 14, No. 3, 8/71, p. 721.

Primary Examiner—A. D. Pellinen
Assistant Examiner—Gregory D. Thompson
Attorney, Agent, or Firm—Robert J. Black

[57] ABSTRACT

A connector for establishing connection between a printed wiring board and a ribbon-type cable through terminals on the printed wiring board and a corresponding contacts on the cable. The contacts are positioned to engage the terminals when the printed wiring board, the ribbon cable, and a resilient pad are compressed between a base and a frame. The frame is urged towards the base by clamps each including a handle pivoted about a pivot point on the frame acting to pull links, which are engaged with hooks attached to the base, toward the frame. Alignment pins are provided extending from the base towards the frame to position the pad and the ribbon cable and prevent their lateral motion relative to the base. A pair of alignment tongues extend from the base at an oblique angle and engage alignment bores in ears of the frame to maintain the frame in alignment with the base while providing wiping action for the contacts during engagement. A pair of handle locks retain the handles in an operated position.

16 Claims, 3 Drawing Figures

PRINTED WIRING BOARD CONNECTOR

BACKGROUND OF THE INVENTION

(1) Field of the Invention

The present invention relates to printed wiring board connectors and, more particularly, to a connector for establishing connection between a printed wiring board and a ribbon-type cable.

(2) Background Art

Printed wiring board connectors are very well known to those skilled in the art. In this regard, connectors are known which may be used to terminate ribbon-type cable conductors by means such as soldering. Such connector receptacles engage connector plugs soldered to printed wiring board conductors or in the alternative, engage press fit pins assembled to the printed wiring board. The press fit pins may be of the type soldered in place within a plated through hole or of the press fit variety.

Such an arrangement while operating generally satisfactorily requires the employment of additional hardware in the form of connector receptacles and connector plugs or in the alternative connector pins, all such items being separately assembled to their respective members. Such assembly carries with it the attendant additional costs and liability of an increased quantity of connections which have been found to be subject to electrical failure. Accordingly, it is an object of the present invention to provide a new and useful connector that provides reduced manufacturing costs and greater connection reliability than found in previously utilized designs.

SUMMARY OF THE INVENTION

The present invention overcomes the above manufacturing cost and reliability problems by providing a connector for establishing connection between a printed wiring board including a first side having a plurality of terminals located thereon and a ribbon-type cable including a plurality of conductors each including an associated contact. The contacts are each positioned to engage a corresponding one of the terminals. The connector includes a base of planar construction positioned adjacent to the contacts and a planar frame attached to the printed wiring board's second side. Guide means are attached to the base and positioned to engage the frame. Clamping means are included and operated to engage the guide means with the frame and the contacts with the terminals to establish connection between the printed wiring board and the ribbon-type cable.

A resilient pad may be included between the base and the ribbon cable to urge the cable into contact with the printed wiring board terminals. The pad may also include mounds formed behind each contact to enhance engagement of the contact with the terminals. A plurality of cable alignment pins which extend perpendicularly from the base through the pad and the cable prevent translational motion of the cable with respect to the base. The clamping means can include a clamp having a handle including an actuating arm and a link pivot positioned on either side of a pivot point. A link is included, attached to the link pivot and adapted to engage a catch in the form of a hook attached to the base.

DESCRIPTION OF THE DRAWING

An understanding of a connector in accordance with the present invention will be apparent from the following description taken in conjunction with the accompanying drawings in which.

DESCRIPTION OF THE PREFERRED EMBODIMENT

Figure 1:
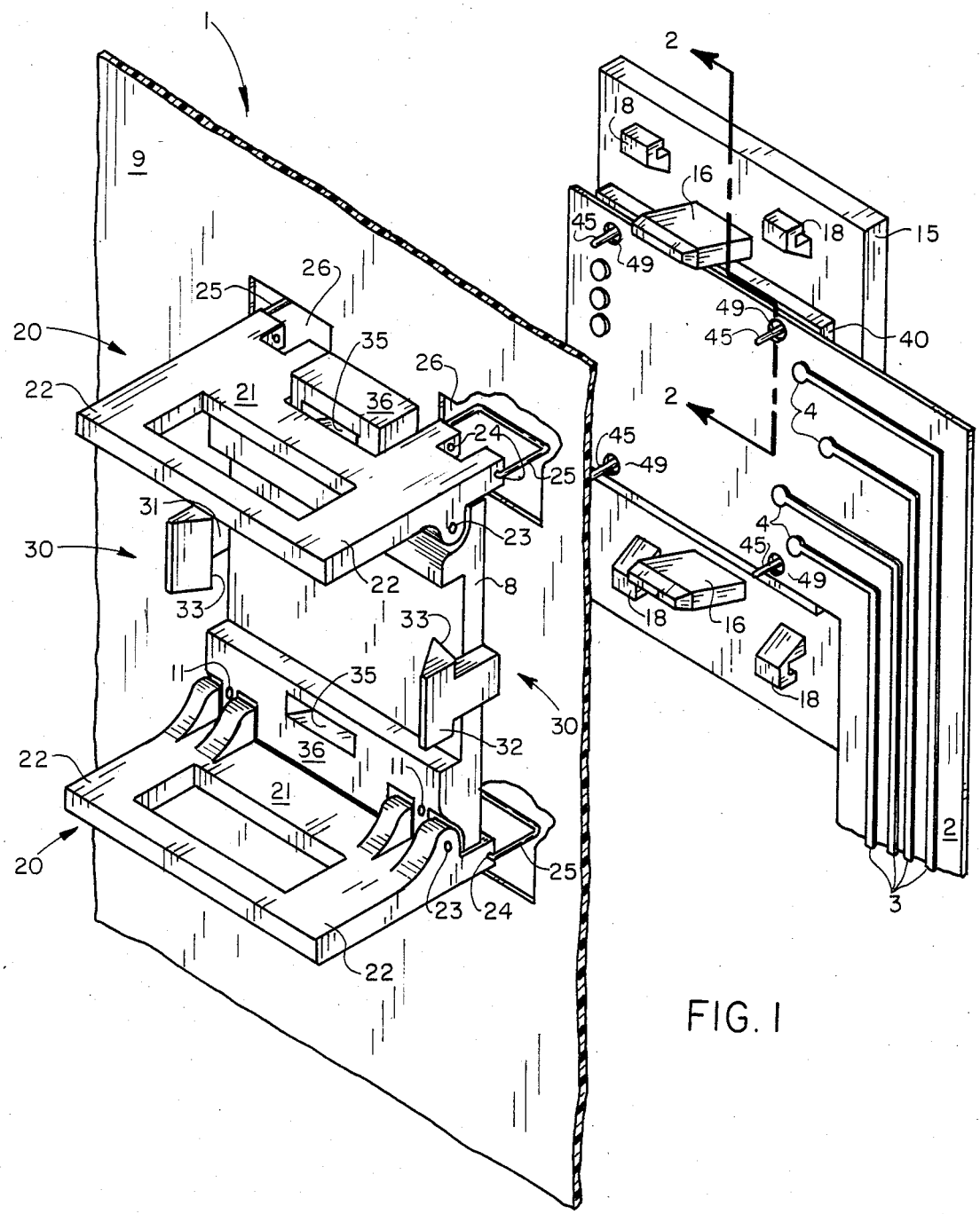
FIG. 1 is a perspective view of the connector of the present invention.

Referring now to FIG. 1, there is shown a connector in accordance with the present invention adapted to connect a printed wiring board 1 to a ribbon-type cable 2 on which are formed a plurality of conductors 3, each including a corresponding contact 4. A corresponding plurality of terminals 5 (shown in FIG. 2) are formed on a first side 6 of the printed wiring board 1. A frame 8 is attached to the printed wiring board 1 on a second side 9 thereof by means generally known to those skilled in the art. In this regard, eyelets 11 may be used to attach the frame 8 to the printed wiring board 9.

A base 15 is included and positioned on a side of the cable 2 away from the printed wiring board 1. The base 15 includes a pair of guide tongues 16 extending from the base at an oblique angle toward the printed wiring board 1. A plurality of catch hooks 18 are attached to the base 15 opening towards the base 15 and adapted to be engaged from the direction of the printed wiring board 1.

Clamps 20 each including a handle 21 having an actuating arm 22, a pivot point 23 and a plurality of link pivots 24 are included to clamp the printed wiring board to the ribbon cable. A plurality of links 25 are engaged with corresponding ones of the link pivots 24. The links 25 may extend through a plurality of printed wiring board apertures 26. Handle locks 30 are included attached to the base 8 and extend perpendicularly therefrom in a direction away from the printed wiring board 1. Each handle lock includes a flexible stem 31 and a head 32 including a handle engaging catch 33.

The tongues 16 each engage the frame 8 via a corresponding bore 35 formed in a corresponding ear 36 of base 8. The tongues 16 and the bores 35 may both be of rectangular cross-section and formed at an oblique angle to the plane of the base 15 for purposes which will be described below.

Figure 2:
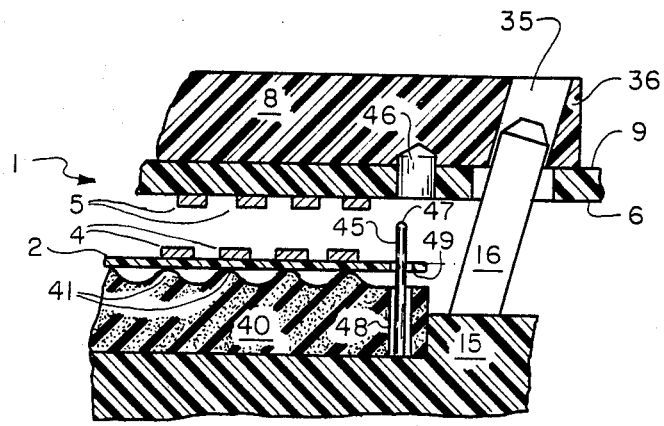
FIG. 2 is an elevational view of the present invention taken along the line 2—2 in FIG. 1 showing the frame and printed wiring board in initial engagement with the base and guide means.

Referring to FIG. 2, a resilient pad 40 is provided between the base 15 and the ribbon cable 2 to urge the ribbon cable into contact with the printed wiring board 1. The resilient pad 40 may include a plurality of mounds 41 formed to engage the ribbon cable 2 at points near the contacts 4 for the purpose of providing a concentrated biasing force to the contacts 4. A plurality of alignment pins 45 are included extending perpendicularly from the base 15 in a direction toward the frame 8, through a corresponding plurality of alignment bores 48 in the resilient pad 40 and a corresponding plurality of alignment holes 49 in the ribbon-type cable 2 to position the pad and cable and to restrict them from longitudinal or translational movement relative to the base 15 while permitting movement of both elements in a direction perpendicular to the base 15. In this regard, should movement of the pad 40 and the cable 2 to the left or right as shown in FIG. 2 be attempted, such action will cause the the alignment pins 45 to contact the alignment bores 48 in the resilient pad 40 and the alignment holes 49 in the ribbon-type cable 2 thereby inhibiting such attempted movement. A corresponding plurality of clearance holes 46 are provided in the printed wiring board 1 and the frame 8 for the upper end 47 of the alignment pin 45 when the connector is positioned in its engaged position.

The connector of the present invention maybe operated by aligning the alignment bores 48 of the resilient pad 40 with the alignment pins 45 and then pressing the resilient pad 40 down along the pins 45 to the base 15. Following positioning of the resilient pad 40, the ribbon cable 2 may be similarly positioned and pressed on the alignment pins 45.

Referring to FIG. 1, connection of the printed wiring board 1 to the ribbon cable 2 may then be accomplished by positioning the frame 8 so as to place the bores 35 of the ears 36 into alignment with the tongues 16 of the base 15. Following initial positioning of the frame 8, the links 25 may then be engaged on the hooks 18 of the base 15. In this regard, the handles 20 may be advantageously positioned so as to place the actuating arms 22 in a perpendicular orientation to the base 8. Thereby permitting the links 25 to extend a greater distance down through the apertures 26 in the printed wiring board 1 and enabling engagement of the links 25 with the hooks 18 with greater ease.

Figure 3:
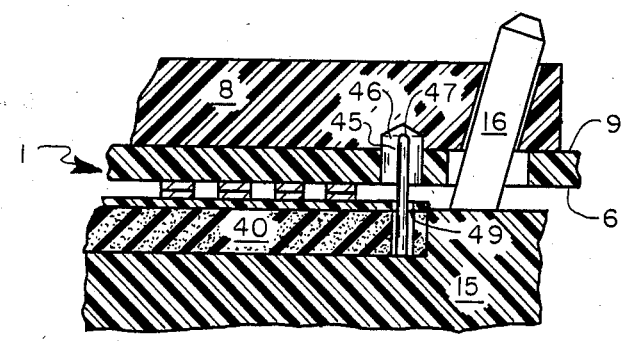
FIG. 3 is an elevational view of the present invention taken along the line 2—2 in FIG. 1 showing the frame and printed wiring board fully engaged with the base and guide means.

Following initial engagement of the links 25 with the hooks 18, the handles 20 may both be pivoted about their pivot points 23 so as to place their actuating arms 22 into engagement with the handle engaging catches 33 of the handle locks 30, thereby urging the printed wiring board 1 towards the ribbon cable. In this regard, upon initial movement of the actuating arms 22 towards each other (refer to FIG. 2) the frame 8 will engage the tongues 16 via the bores 35 of the ears 36 and slide therealong in an oblique direction towards the base 15 bringing the terminals 5 of the printed wiring board 1 into engagement with the contacts 4 of the ribbon cable 2. The continued movement of the actuating arms 22 in a direction towards each other will then force the frame 8 closer to the base 15 thereby compressing the mounds 41 of the resilient pad 40 and the resilient pad 40 itself (shown in FIG. 3). At the same time the oblique movement of the frame 8 relative to the base 15 will cause the contacts 4 of the ribbon cable 2 to wipe along the terminals 5 of the printed wiring board 1 thereby rubbing away surface contamination and insuring a reliable connection. The further movement of the actuating arms 22 towards each other will cause the arms to engage and deflect the handle locks 30 away from each other thereby permitting the handles to pass and engage the handle engaging catches 33 locking the handles in their operated positions.

The connector of the present invention may be released by forcing the handle locks 30 apart thereby releasing the actuating arms 22 of the handles 21 and permitting them to pivot away from each other thereby releasing the forces clamping the frame 8 to the base 15. Upon release of the clamping forces the resilient pad 40 and the mounds 41 will urge the frame 8 away from the base 15. The handles 21 may then be moved to a perpendicular orientation relative to the base and the links 25 disengaged from the hooks 18. Following disengagement of the links 25 from the hooks 18 the printed wiring board 1 may be moved in an oblique direction away from the base 15 thereby removing it from contact and engagement with the ribbon cable 2.

It will now be apparent that a connector has been described here and above which offers significant advantages over prior art assemblies. The connector permits connection to be established between printed wiring board and a ribbon cable utilizing less components and more economical manufacturing procedures than prior art assemblies. Additionally, the oblique placement of the alignment tongue and the alignment bore permit contact wiping during engagement and disengagement thereby increasing contact reliability.

Although the preferred embodiment of the present invention has been illustrated, and the form described in detail, it will be readily apparent to those skilled in the art that various modifications may be made therein without departing from the spirit of the invention or the scope of the appended claims.

What is claimed is:

1. In combination, a printed wiring board, a cable and a connector establishing connection between said printed wiring board and said cable, said printed wiring board including a plurality of terminals on a first side thereof and including a second side, said cable including a plurality of conductors each including a contact, and said connector comprising:

a base of planar construction positioned on a side of said cable away from said printed wiring board;

a planar frame attached to said printed wiring board second side;

a resilient pad positioned between said cable and said base;

guide means attached to said base and engaging said frame to engage said contacts with said terminals; and clamping means securing said printed wiring board to said cable;

whereby, said printed wiring board is connected to said cable.

2. The combination as claimed in claim 1, wherein: said resilient pad includes a plurality of mounds formed on a first side thereof, said mounds each positioned adjacent a corresponding one of said contacts.

3. The combination as claimed in claim 1, wherein: said base includes a cable alignment means positioning said cable relative to said base.

4. The combination as claimed in claim 3, wherein: said cable includes a plurality of alignment holes and said cable alignment means includes a plurality of pins extending perpendicularly from said base through a corresponding plurality of alignment bores in said pad and through said cable alignment holes, said pins engaging said pad and said cable to inhibit translational motion of said cable and pad relative to said base.

5. The combination as claimed in claim 1, wherein: said frame includes an ear, said guide means engaging said frame at said ear.

6. The combination as claimed in claim 5, wherein: said ear includes a bore, said guide means engaging said ear bore.

7. The combination as claimed in claim 6, wherein: said ear bore is of rectangular cross-section and said guide means is also of rectangular cross-section and sized to fit within said ear bore.

8. The combination as claimed in claim 6, wherein: said ear bore and said guide means are formed at an oblique angle to said base, said ear bore engaged with and slid along said guide means in an oblique direction following engagement of said contacts with said terminals to cause said contacts to wipe along said terminals.

9. The combination as claimed in claim 1, wherein: said clamping means are attached to said frame.

10. The combination as claimed in claim 9, wherein: said clamping means includes at least one handle attached to said frame at a pivot point, and a catch attached to said base, said handle further including an actuating arm and catch engaging means, said handle operated to position said actuating arm in an orientation perpendicular to said base thereby to pivot said handle about said pivot point and engage said catch engaging means with said catch.

11. The combination as claimed in claim 10, wherein: said pivot point is positioned between said actuating arm and said catch engaging means.

12. The combination as claimed in claim 10, wherein: said clamping means includes at least another handle and said catch engaging means includes a link pivot point and a link pivotally attached at said link pivot point, said link engaging said catch when said operating arms of each of said handles are moved from an orientation perpendicular to said base toward said operating arms of said other handle to secure said printed wiring board to said base.

13. The combination as claimed in claim 12, wherein: said catch includes a hook engaging said link.

14. The combination as claimed in claim 10, wherein: said clamping means includes a handle lock attached to said frame, said handle lock engaging said handle when said handle is in an operated position to retain said handle thereat.

15. The combination as claimed in claim 14, wherein: said handle lock includes a flexible stem extending from said base away from said printed wiring board.

16. The combination as claimed in claim 14, wherein: said handle lock includes a handle engaging catch of rigid construction, said catch engaging said actuating arm of said handle when said handle is in said operated position to retain said arm thereat.

* * * * *